United States Patent
Takagi et al.

(10) Patent No.: US 7,502,541 B2
(45) Date of Patent: Mar. 10, 2009

(54) RESONATOR, LIGHT EMITTING DEVICE, AND WAVELENGTH CONVERSION DEVICE

(75) Inventors: Akinari Takagi, Utsunomiya (JP); Hikaru Hoshi, Utsunomiya (JP); Kiyokatsu Ikemoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 182 days.

(21) Appl. No.: 11/250,747

(22) Filed: Oct. 14, 2005

(65) Prior Publication Data
US 2006/0083477 A1 Apr. 20, 2006

(30) Foreign Application Priority Data
Oct. 15, 2004 (JP) .............. 2004-301374

(51) Int. Cl.
*G02B 6/12* (2006.01)
(52) U.S. Cl. .............. 385/129; 385/130; 385/131; 385/14; 385/132; 385/125; 385/39; 372/43.01; 372/44.011; 372/50.1
(58) Field of Classification Search ......... 385/129–132, 385/125, 146, 39, 14; 372/43.01, 44.011, 372/50.1; 359/237, 247, 248, 321; 438/962
See application file for complete search history.

(56) References Cited

U.S. PATENT DOCUMENTS

| 5,335,240 | A |   | 8/1994  | Ho |
|-----------|---|---|---------|----|
| 5,406,573 | A | * | 4/1995  | Ozbay et al. |
| 5,784,400 | A | * | 7/1998  | Joannopoulos et al. |
| 6,134,043 | A | * | 10/2000 | Johnson et al. ......... 359/237 |
| 6,358,854 | B1 | * | 3/2002 | Fleming et al. |
| 6,392,787 | B1 | * | 5/2002 | Cirelli et al. ......... 359/321 |
| 6,555,406 | B1 | * | 4/2003 | Leung et al. |
| 6,690,876 | B2 | * | 2/2004 | Sigalas |
| 6,735,235 | B2 | * | 5/2004 | Sigalas |
| 6,812,482 | B2 | * | 11/2004 | Fleming et al. ......... 257/17 |
| 6,993,235 | B2 | * | 1/2006 | Takagi et al. ......... 385/129 |
| 7,039,287 | B2 | * | 5/2006 | Takagi et al. ......... 385/129 |
| 7,085,467 | B2 | * | 8/2006 | Ikemoto et al. ......... 385/129 |
| 7,151,629 | B2 | * | 12/2006 | Takagi et al. ......... 359/321 |
| 7,184,642 | B2 | * | 2/2007 | Hoshi et al. ......... 385/129 |
| 7,209,622 | B2 | * | 4/2007 | Hoshi et al. ......... 385/129 |
| 7,274,849 | B2 | * | 9/2007 | Nobayashi et al. ......... 385/131 |
| 7,313,307 | B2 | * | 12/2007 | Ikemoto et al. ......... 385/129 |
| 2004/0027646 | A1 | * | 2/2004 | Miller et al. ......... 359/322 |

(Continued)

FOREIGN PATENT DOCUMENTS

JP 2004-004419 A 1/2004

(Continued)

OTHER PUBLICATIONS

E. Yablonovitch, Inhibited Spontaneous Emission in Solid-State Physics and Electronics, Physical Review Letters, vol. 58, p. 2059-2062 (1987).

(Continued)

*Primary Examiner*—James P Hughes
(74) *Attorney, Agent, or Firm*—Canon U.S.A., Inc., IP Division

(57) ABSTRACT

A resonator is provided which is produced by a defect formed in a three-dimensional photonic crystal. The three-dimensional photonic crystal can include layers containing a plurality of columnar structures with discrete structures in sub-layers.

14 Claims, 15 Drawing Sheets

U.S. PATENT DOCUMENTS

| | | | |
|---|---|---|---|
| 2004/0062505 A1* | 4/2004 | Sugitatsu et al. | |
| 2004/0258383 A1* | 12/2004 | Sato et al. | |
| 2005/0196118 A1* | 9/2005 | Ikemoto et al. | 385/129 |
| 2005/0207717 A1* | 9/2005 | Takagi et al. | 385/129 |
| 2005/0220402 A1* | 10/2005 | Takagi et al. | 385/31 |
| 2005/0238310 A1* | 10/2005 | Hoshi et al. | 385/129 |
| 2006/0029349 A1* | 2/2006 | Hoshi et al. | 385/129 |
| 2006/0251372 A1* | 11/2006 | Nobayashi et al. | 385/129 |
| 2006/0262385 A1* | 11/2006 | Takagi et al. | 359/321 |
| 2006/0275005 A1* | 12/2006 | Hoshi et al. | 385/129 |
| 2007/0025682 A1* | 2/2007 | Takagi et al. | 385/147 |
| 2007/0104442 A1* | 5/2007 | Nobayashi et al. | 385/129 |
| 2007/0110381 A1* | 5/2007 | Ikemoto et al. | 385/131 |
| 2007/0110382 A1* | 5/2007 | Ikemoto et al. | 385/131 |

FOREIGN PATENT DOCUMENTS

| | | | |
|---|---|---|---|
| JP | 2004-6567 A | | 1/2004 |
| JP | 2004-006567 | * | 8/2004 |

OTHER PUBLICATIONS

S. Ogawa, et al., "Control of light emission by 3D photonic crystal", Lasers and Electro-Optics, 2004, Conference on San Francisco, vol. 2, May 2004, pp. 928-929, XP010745054.

M. Maldovan, et al., "Layer-by-layer diamond-like woodpile structure with a large photonic band gap", Applied Physics Letters, AIP, vol. 84, No. 3, Jan. 2004, pp. 362-364.

C. Luo, et al., "All-angle negative refraction in a three-dimensionally periodic photonic crystal", Applied Physics Letters, AIP, vol. 81, No. 13, Sep. 2002, pp. 2352-2354.

* cited by examiner

RESONATOR, LIGHT EMITTING DEVICE, AND WAVELENGTH CONVERSION DEVICE

BACKGROUND OF THE INVENTION

1. Field of the Invention

The present invention relates to a resonator using a three-dimensional photonic crystal, more particularly, though not exclusively, the present invention relates to a resonator formed from a defect in a photonic crystal.

2. Description of the Related Art

Yablonovitch has proposed an idea of controlling the transmission and reflection characteristics of electromagnetic waves by structures smaller than or equal to a wavelength in Physical Review Letters, Vol. 58, p. 2059, 1987. This document has taught that the transmission and reflection characteristics of electromagnetic waves can be controlled by periodically arranging structures smaller than or equal to a wavelength. A photonic crystal can be such a unit of periodically arranged structures, and suggests that a reflection mirror exhibiting no optical loss, namely, a reflectance of about 100%, can be achieved in a specific wavelength region. This region is referred to as a photonic band gap, likened to an energy gap of a semiconductor. In particular, a three-dimensional microscopic periodic structure can produce a photonic band gap for all the light entering from any direction (hereinafter referred to as complete photonic band gap). The complete photonic band gap can have various applications (e.g., light emitting devices, control of spontaneous emission).

Woodpile structures in which columnar structures are periodically stacked in a layered manner have been discussed in, for example, U.S. Pat. No. 5,335,240 and Japanese Patent Laid-Open No. 2004-6567. Japanese Patent Laid-Open No. 2004-6567 has also discussed a resonator using a woodpile structure having a defect inside. The defect is formed in a rectangular solid shape with the same thickness as that of the columnar structure, and is present among the columnar structures. In general, a resonator produced by a defect formed in a photonic crystal has plural resonance modes. Resonators used in light emitting devices or wavelength selection filters have designed confinement effects and satisfy resonance requirements for a designed resonant wavelength. In addition, in order to avoid the influence of other resonance modes having a wavelength close to the designed wavelength, for example, to reduce the effect of mode hopping in a laser, one can provide a large difference between the designed resonant wavelength and the wavelengths of the resonant in the other resonance modes.

The periodicity around the defect of the periodic structure can be increased to increase the reflectance. Japanese Patent Laid-Open No. 2004-6567 has also discussed another approach in which the difference in resonant wavelength between adjacent resonance modes is controlled by varying the lengths of two sides other than the thickness of rectangular solid defect, and by shifting the position of the defect with respect to the columnar structures. Unfortunately, the shift of the position of the defect makes the periodic structure asymmetrical, so that the energy distribution of the electromagnetic field in the resonator is also made asymmetrical. If the resonator is used in a laser, such asymmetry causes a large deflection of the orientation of the emitted light and may result in a critical problem. In addition, the maximum of the shift in the position of the defect is ¼ of the period of columnar structure arrangement, making the choices of designed resonant wavelength limited.

SUMMARY OF THE INVENTION

Accordingly, an exemplary embodiment is directed to a resonator resonating in a single mode with a symmetrical energy distribution of an electromagnetic field.

At least one exemplary embodiment is directed to a resonator, which can be by a point defect formed in a three-dimensional photonic crystal. The three-dimensional photonic crystal can include a first layer to a fourth layer. The first layer includes a plurality of columnar structures spaced apart by a first predetermined interval. The second layer includes a plurality of columnar structures spaced apart by a second predetermined interval, the columnar structures of the second layer extending in a direction different from that of the columnar structures in the first layer. The third layer includes a plurality of columnar structures spaced apart by a third predetermined interval, the columnar structures of the third layer extending in about the same direction as that of the columnar structures in the first layer. The fourth layer includes a plurality of columnar structures spaced apart by a fourth predetermined interval, the columnar structures extending in substantially the same direction as that of the columnar structures in the second layer. The first to fourth layers can be stacked such that the columnar structures of the first layer are shifted by about half of the regular interval in the direction substantially perpendicular to the direction of the extension of the columnar structures of the first and third layers, and such that the columnar structures of the second layer are shifted by about half of the regular interval in the direction perpendicular to the direction of the extension of the columnar structures of the fourth layer. The point defect can have a thickness different from each thickness of the four layers.

Further features of the present invention will become apparent from the following description of exemplary embodiments with reference to the attached drawings.

DESCRIPTION OF THE EMBODIMENTS

The following description of at least one of the possible exemplary embodiment(s) is merely illustrative in nature and is in no way intended to limit the invention, its application, its equivalents, or uses.

Processes, techniques, apparatus, and materials as known by one of ordinary skill in the art may not be discussed in detail but are intended to be part of the enabling description where appropriate. For example some examples of photonic crystal formation are discussed, equivalents and other photonic crystal configurations and materials used, as known by one of ordinary skill in the relevant arts, are intended to be included in the scope of at least a few exemplary embodiments.

Additionally, referral is made herein of columnar structures. The columnar structures of a woodpile is one non-limiting example of a columnar structure, other non-limiting examples include non-columnar structures, non-uniform cross-sectional structures, other structures used in photonic crystals as known by one of ordinary skill in the relevant arts and equivalents.

Additionally, the actual size of structures may not be discussed however any size from micrometer (centimeter to meters) to nanometer and below sized photonic crystal structures are intended to lie within the scope of exemplary embodiments (e.g., photonic structures with characteristic sizes of individual molecules, nanometer size, micro size, centimeter, and meter sizes).

Additionally, exemplary embodiments are not limited to visual optical systems; photonic crystal structures can be constructed for use with infrared and other wavelength systems. For example an infrared light detector (e.g., a detector measuring infrared markings).

First Exemplary Embodiment

Figure 1:
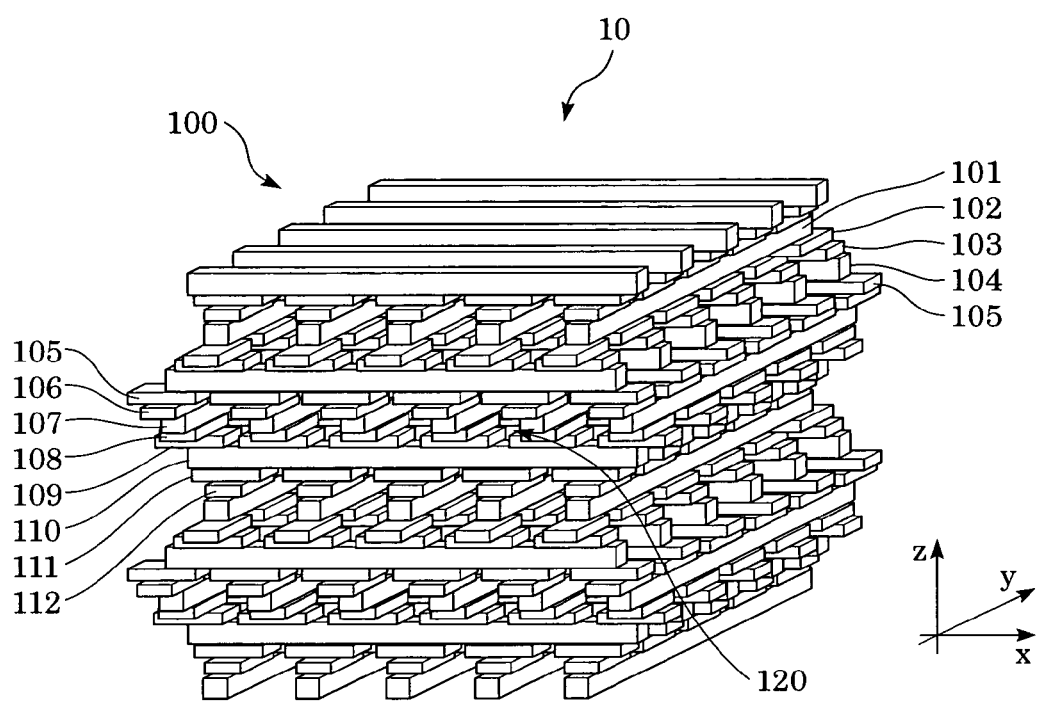
FIG. 1 illustrates a schematic illustration of a resonator using a three-dimensional photonic crystal according to a first exemplary embodiment.
Figure 2:
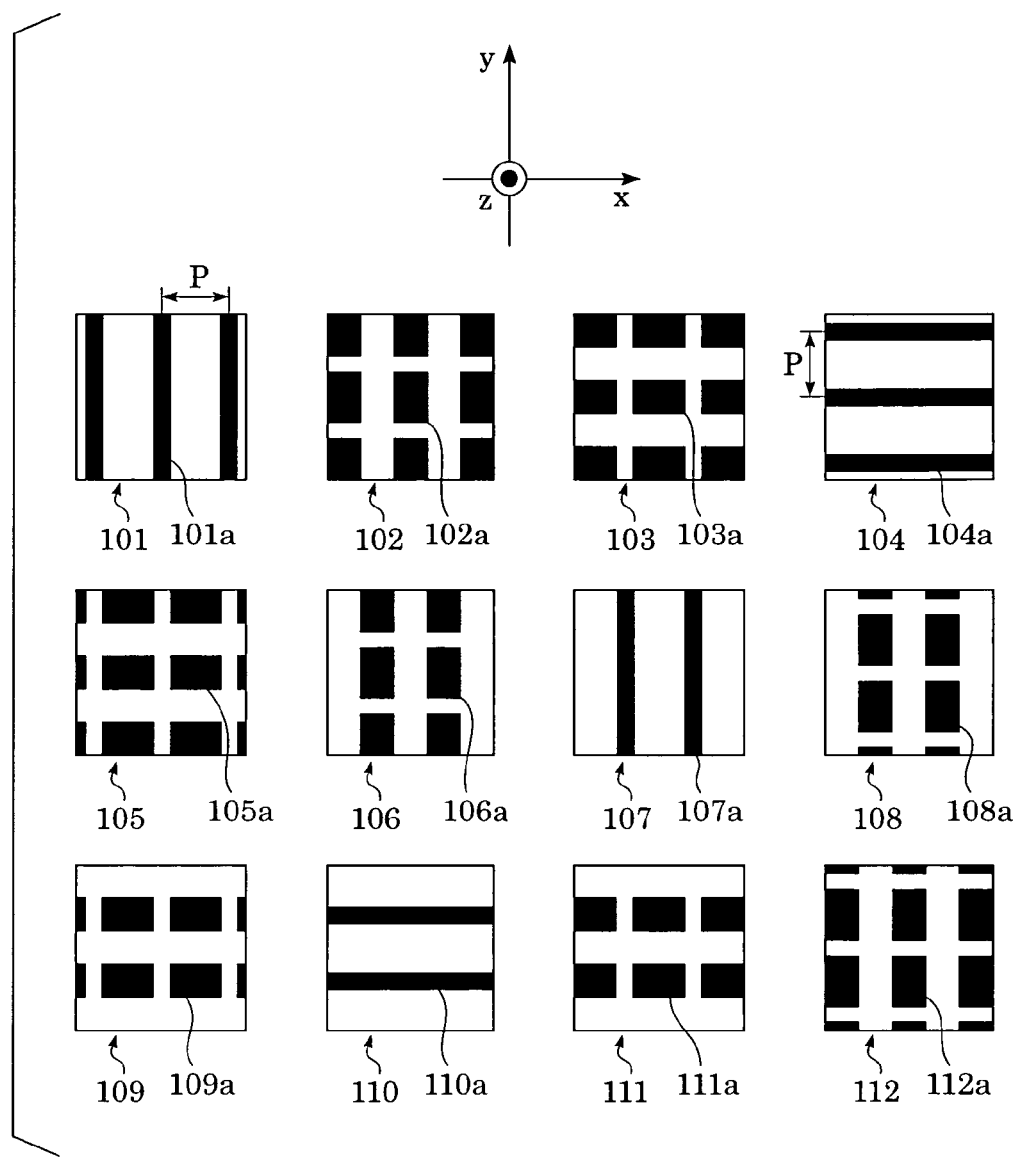
FIG. 2 illustrates schematic xy sectional views of layers of the resonator shown in FIG. 1.

FIG. 1 illustrates a schematic representation of a resonator using a three-dimensional photonic crystal according to a first exemplary embodiment. The resonator 10 is produced by (i.e., includes) a point defect 120 formed in a periodic structure 100 or three-dimensional photonic crystal. The periodic structure 100 has a period comprising 12 layers in xy planes from a first layer 101 to a twelfth layer 112. FIG. 2 illustrates the xy sections of the 12 layers. The first layer 101 and the seventh layer 107 each contain a plurality of columnar structures 101a or 107a that are formed of a first medium (e.g., having a high refractive index) and extend in the y-axis direction and are arranged at regular intervals (lattice period) p in the x-axis direction. The columnar structures 101a of the first layer 101 are shifted by, for example, P/2 in the X-axis direction with respect to the columnar structures 107a of the seventh layer 107. The fourth layer 104 and the tenth layer 110 each contain a plurality of columnar structures 104a or 110a that are formed of a medium (e.g., the first medium) and extend in the x-axis direction and are arranged at regular intervals P in the y-axis direction. The columnar structures 104a of the forth layer 104 are shifted by, for example, P/2 in the y-axis direction with respect to the columnar structures 110a of the tenth layer 110. The second layer 102 and the third layer 103, which define an additional layer, each contain discrete structures 102a or 103a that are formed of the a medium (e.g., the first medium) and are separately disposed at positions in the xy planes, corresponding to the intersections of the columnar structures 101a of the first layer 101 and the columnar structures 104a of the fourth layer 104. The discrete structures 102a and the discrete structures 103a can be symmetrically disposed such as to be rotated at an angle of 90° with respect to each other in the respective xy planes. Other additional layers, namely, the fifth layer 105 and sixth layer 106, the eighth layer 108 and ninth layer 109, and the eleventh layer 111 and twelfth layer 112, can each be disposed between the columnar structure-containing layers. Note that although additional layers (e.g., 102, 103) are discussed between each pair of layers (e.g., 101 and 104), other exemplary embodiments can have one additional layer between one pair of layers, and not have subsequent additional layers, thus the discussion herein should not be interpreted to limit the number or arrangement of additional layers in exemplary embodiments.

The layers (sublayers of the additional layers) 105, 106, 108, 109, 111, and 112 respectively can contain discrete structures 105a, 106a, 108a, 109a, 111a, and 112a that are formed of the a medium (e.g., the first medium) and are separately disposed in positions in the respective xy planes corresponding to the intersections of their adjacent columnar structure-containing layers, in the same manner. Note that although the present example of the first exemplary embodiment discusses the discrete structures (e.g., 105a) as being made from the first medium, in actuality there are no such limits on exemplary embodiments. An exemplary embodiment can have discrete structures made of a medium different than that from which any of the columnar structures are composed. The columnar structures in each layer can be in contact with the discrete structures in the adjacent additional layers. The regions other than the columnar structures or discrete plates in each layer are filled with a second medium (e.g., having a low refractive index). Parameters, such as the refractive indices of the first and second media, the shapes and intervals of the columnar structures and discrete structures, and the thicknesses of the layers, are optimally set so as to produce a wide complete photonic band gap in a desired frequency region (wavelength region).

Note that some layers have columnar structures, in the example of exemplary embodiment 1 discussed, made of the same medium. This is for illustrative purposes only and the columnar structures can be made of different materials. For example, each layer can have columnar structures made of different materials, some can be made of the same, or even columnar structures within a layer can be made of different materials.

Also note that a shift of P/2 is discussed, however various shift values can be used depending upon the design, and the discussion herein should not be interpreted to limit the amount of shifts between layers.

Figure 4:
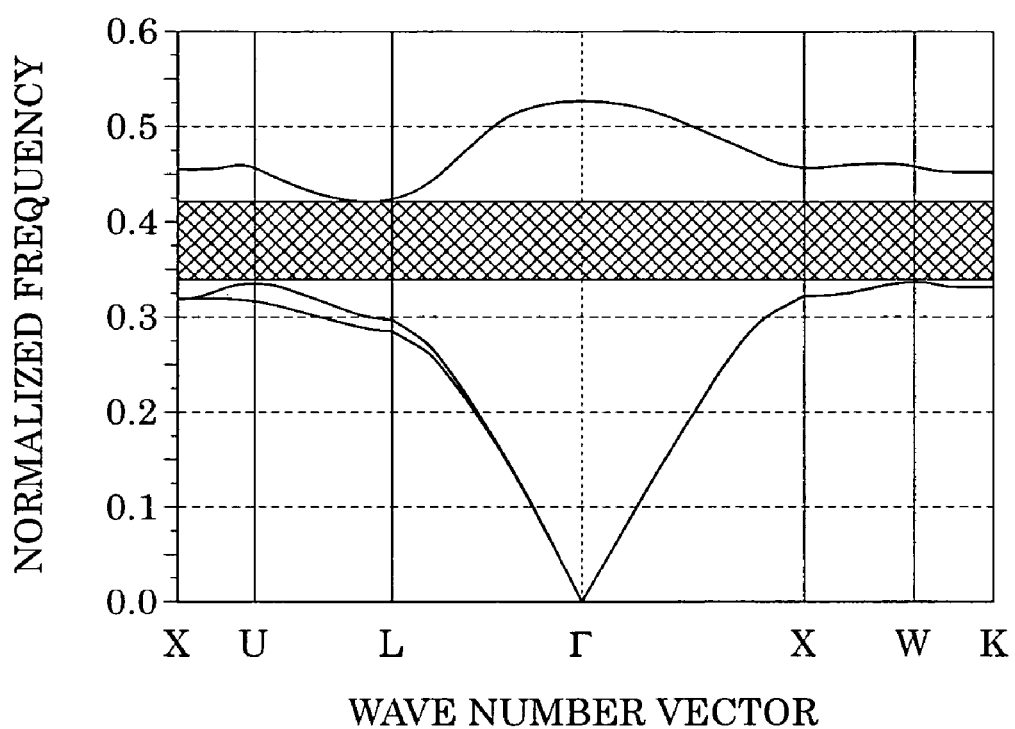
FIG. 4 illustrates a graph showing a photonic band structure according to the first exemplary embodiment.

In the example of a first exemplary embodiment, a medium (e.g., the first medium) has a refractive index of about 3.3, and the second medium has a refractive index of about 1. The intervals between the columnar structures are P; each columnar structure-containing layer has a thickness, or length in the z direction, of $0.25 \times P$; each discrete-structure-containing layer has a thickness of $0.05 \times P$. Each columnar structure has a long rectangular solid shape with a height, or length in the z direction, of $0.25 \times P$ and a width, or length in the x- or y-axis direction, of $0.3 \times P$. Each discrete structure has a rectangular solid shape with a thickness, or length in the z direction, of $0.05 \times P$ and an xy cross section of $0.4 \times P$ by $0.6 \times P$. FIG. 4 illustrates a photonic band structure of the periodic structure 100 calculated by a mathematical method (e.g., plane wave expansion method). In FIG. 4, the horizontal axis represents the wave number vector, that is, the direction in which electromagnetic waves propagate in the photonic crystal. For example, K on the horizontal axis represents a wave number vector parallel to the x-axis direction (or y-axis direction), and X on the horizontal axis represents a wave number vector in xy planes, forming an angle of 45° with the x axis (or y axis). The vertical axis represents the frequency normalized with the lattice period of the periodic structure. FIG. 4 shows that light entering from any direction cannot be present in the region indicated by hatching in the normalized frequency range of 0.34 to 0.42; hence, a complete photonic band gap is produced in this frequency range. For example, when the intervals P between the columnar structures are 0.5 µm, a complete photonic band gap is produced in the wavelength region of 1.19 to 1.47 µm; when the intervals P are 200 nm, a complete photonic band gap is produced in the wavelength region of 480 to 590 nm.

Note that the rectangular discrete structures illustrated in the example of the first exemplary embodiment are for illustrative, non-limiting, purposes only. In actuality the shape of the discrete structures are not limited in exemplary embodiments.

Figure 3:
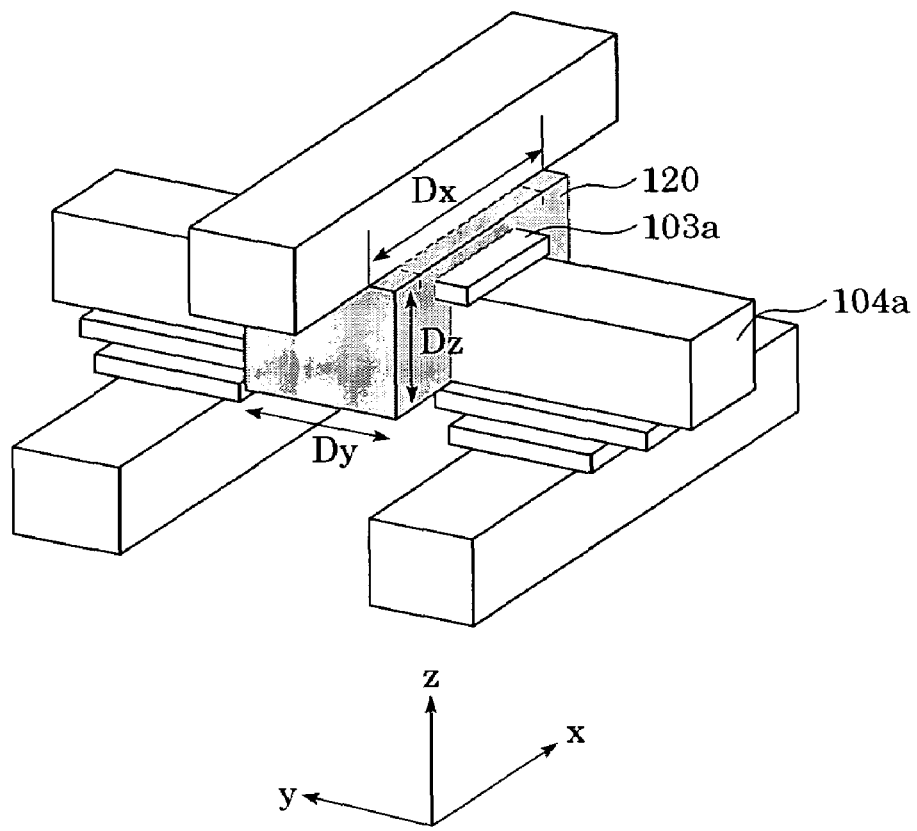
FIG. 3 illustrates an enlarged view of a region around a point defect of the resonator shown in FIG. 1.

FIG. 3 illustrates an enlarged view of a region around the point defect 120. The point defect 120 is formed of a medium (e.g., the first medium) in a solid shape (e.g., rectangular) with a thickness Dz, a length Dx in the x-axis direction, and a length Dy in the y-axis direction. The point defect 120 facilitates the presence only therein of electromagnetic waves in a part of the wavelength region of the photonic band gap of the periodic structure 100. Thus, electromagnetic waves can be confined in a very small region, and the point defect 120 can serve as a high-performance resonator exhibiting a high confinement effect. The state in which electromagnetic waves are facilitated to be present in a photonic band gap that is caused by providing the point defect is hereinafter referred to as a defect mode; the frequency of the electromagnetic waves in this state is referred to as a defect mode frequency; and the distribution of electromagnetic energy in a resonator produced by the point defect is referred to as a defect mode pattern.

Figure 5:
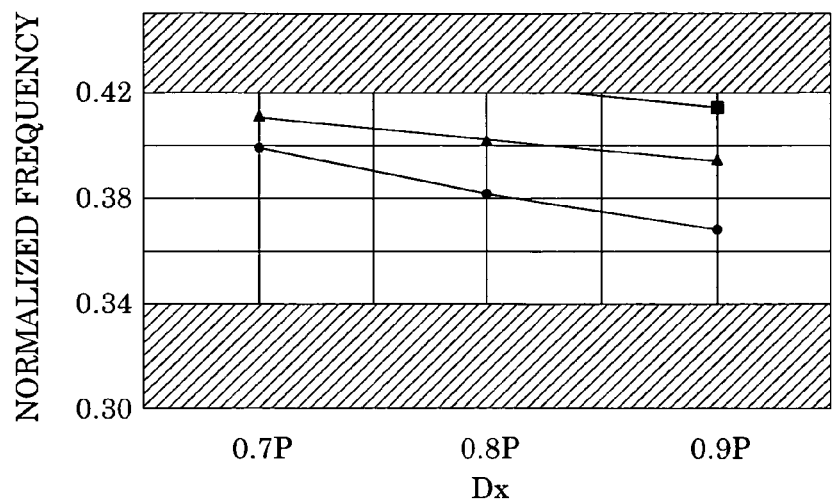
FIG. 5 illustrates a graph showing the relationship between the defect mode frequencies and the length Dx, in the x-axis direction, of the point defect according to the first exemplary embodiment.
Figure 6:
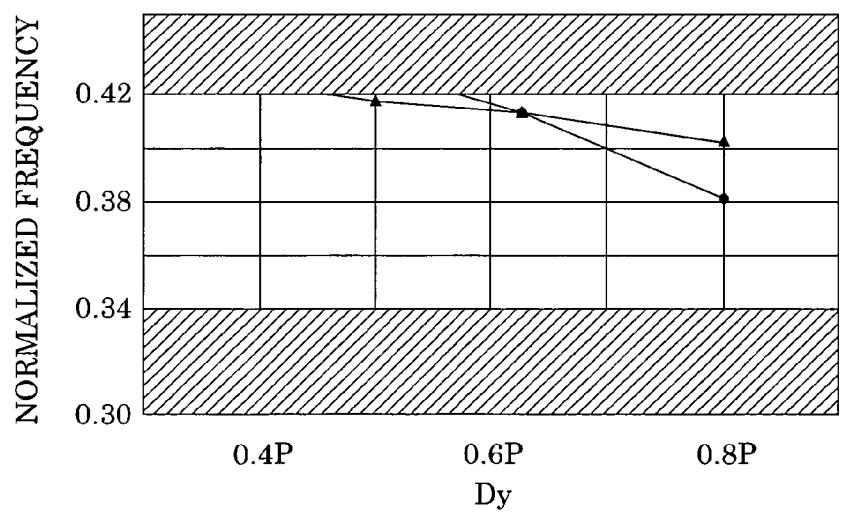
FIG. 6 illustrates a graph showing the relationship between the defect mode frequencies and the length Dy, in the y-axis direction, of the point defect according to the first exemplary embodiment.
Figure 7:
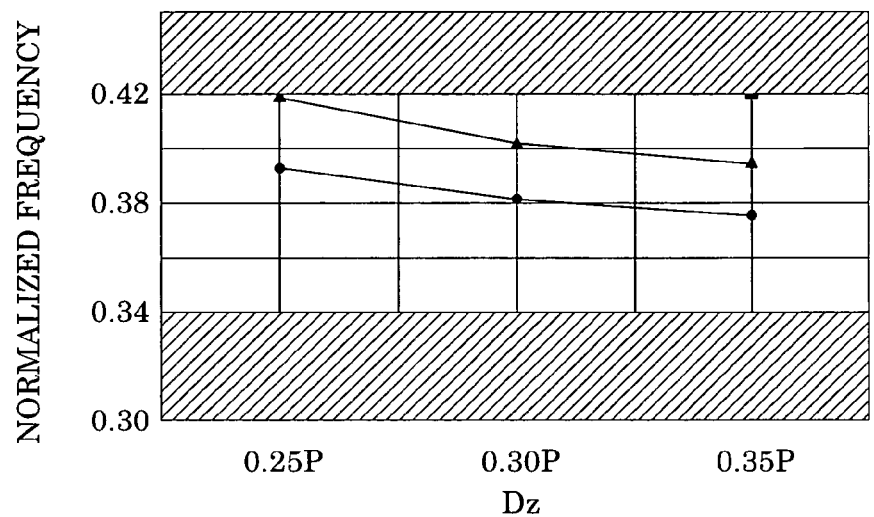
FIG. 7 illustrates a graph showing the relationship between the defect mode frequencies and the thickness Dz of the point defect according to the first exemplary embodiment.

FIGS. 5 to 7 illustrate how the defect mode frequencies of the resonator 10 shown in FIG. 1 are changed depending on parameters of the shape of the point defect 120, according to the results of calculations by a mathematical method (e.g., the FDTD (Finite Difference Time Domain) method). FIG. 5 illustrates the relationship between the defect mode frequencies and length Dx when the dimensions of the point defect are $Dz=0.3 \times P$ and $Dx=Dy$. For example, referring to FIG. 3, the point defect 120 used for the calculations is formed in two layers containing the columnar structures 104a and the discrete structures 103a such that the center coordinates in the x- and y-axis directions of the point defect 120 are the same as the center coordinates in the x- and y-axis directions of one of the discrete structures 103a. The hatched frequency regions in FIG. 5 represent frequencies outside the complete photonic band gap. FIG. 6 illustrates the relationship between the defect mode frequencies and length Dy when the dimensions of the point defect are $Dz=0.3 \times P$ and $Dx=0.8 \times P$. For example, referring to FIG. 3, the point defect 120 used for the calculations is formed in two layers containing the columnar structures 104a and the discrete structures 103a such that the center coordinates of the point defect 120 in the x- and y-axis directions are the same as the center coordinates in the x- and y-axis directions of one of the discrete structures 103a. FIG. 7 illustrates the relationship between the defect mode frequencies and length Dz when the dimensions of the point defect are $Dx=0.8 \times P$ and $Dy=0.8 \times P$. For example, referring to FIG. 3, the point defect 120 used for the calculations is formed such that its center coordinates in the x- and y-axis directions are the same as the center coordinates in the x- and y-axis directions of one of the discrete structures 103a, and such that its minimum coordinate in the z direction is the same as the minimum coordinate in the z direction of the columnar structures 104a. The variation in defect mode frequency for the shape of the point defect depends on the dimensional parameters. This suggests that the defect mode frequency can be controlled by varying the shape of the point defect. The manner of the changes in defect mode frequency for Dz values is distinguished from the manners of the changes for Dx and Dy values, as shown in FIGS. 5 to 7. This distinction facilitates setting the defect mode frequencies with large intervals so that a designed defect mode frequency can be set with reduced influence of the adjacent defect modes.

Figure 8:
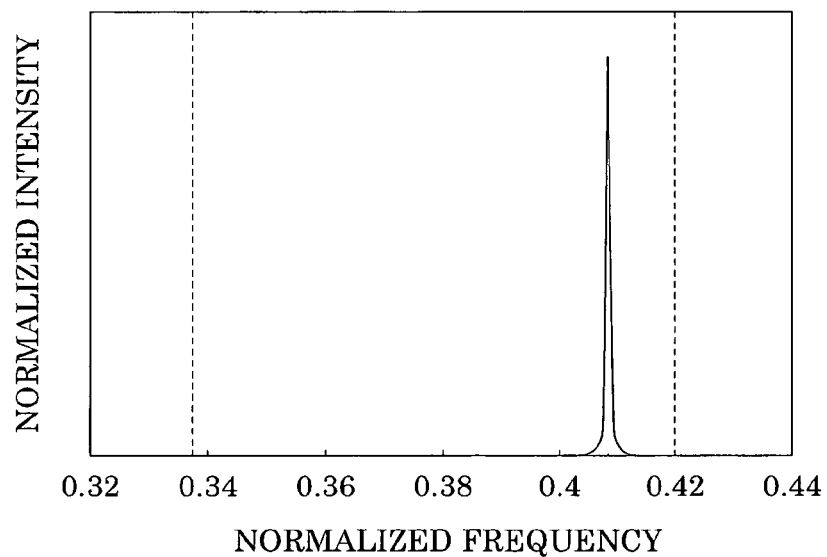
FIG. 8 illustrates a spectrum of defect mode frequency according to the first exemplary embodiment.
Figure 9:
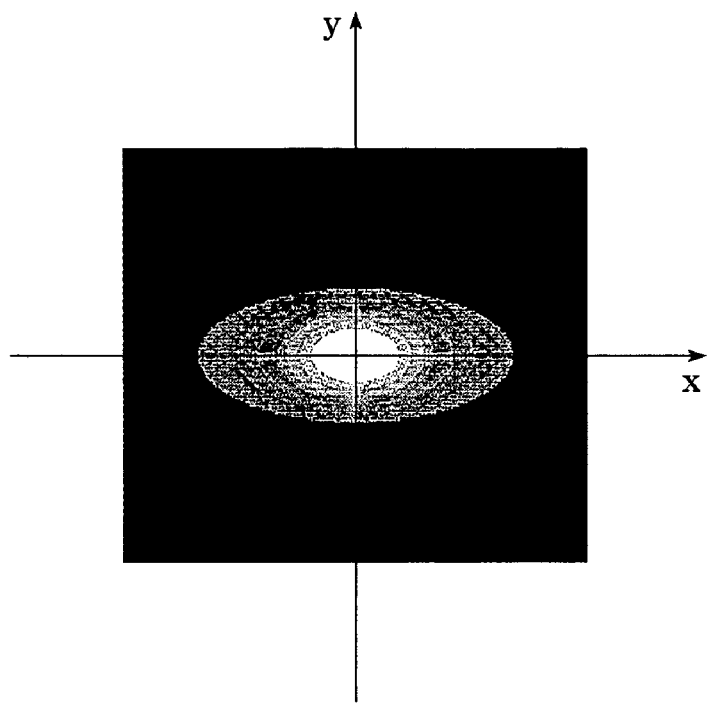
FIG. 9 illustrates a defect mode pattern of an xy section according to the first exemplary embodiment.

For example, a single defect mode can be produced in the photonic band gap, that is, a single mode can be achieved, by designing the point defect 120 in FIG. 3 at dimensions of $Dx=P$, $Dy=0.3 \times P$, and $Dz=0.35 \times P$ such that its center coordinates in the x- and y-axis directions are the same as the center coordinates in the x- and y-axis directions of one of the discrete structures 103a, and such that its minimum coordinate in the z direction is the same as the minimum coordinate in the z direction of the columnar structures 104a. In this instance, the point defect 120 can be formed in a discrete-structure-containing layer and its adjacent columnar structure-containing layer. In view of the manufacturing process, the thickness Dz of the point defect 120 can be related to the sum of the thicknesses of the discrete-structure-containing layer and the columnar structure-containing layer. By forming the point defect in a columnar structure-containing layer and at least one discrete-structure-containing layer (e.g., where the discrete-structure-containing layer has a thickness smaller than that of the columnar structure-containing layer), control of the defect mode frequency can be facilitated. FIG. 8 illustrates the spectrum of defect mode frequency of a periodic structure 100 formed at 8 periods in the x- and y-axis directions and 4 periods in the z direction with the point defect 120 at the center of the periodic structure, while FIG. 9 illustrates a defect mode pattern of an xy section of the periodic structure. In FIG. 9, the white region indicates a higher energy area and the black region indicates a lower energy area. FIGS. 8 and 9 show that a highly symmetrical single defect mode can be achieved.

The Q factor, which represents a property of the light confinement of a resonator and is defined as the quotient of energy stored in a resonator divided by energy lost in a unit time from the resonator, of the defect mode shown in FIG. 8 is about 3,800. The Q factor is logarithmically increased by increasing the number of the period of the periodic structure 100. For example, the Q factor can be increased to about $3 \times 10^8$ by setting the number of periods in the x- and y-axis directions at 20P and in the z direction at 16P. The number of periods of the periodic structure can be selected from numbers capable of producing a desired confinement effect.

Designed defect mode frequencies can be obtained by designing the periodic structure under controlled conditions for example by controlling, the refractive indices of the first and second media, the shapes and intervals of the columnar structures and the discrete structures, and the thicknesses of the layers, so that a complete photonic band gap is produced in a frequency region including the designed defect mode frequency. Where controlled conditions can be used to form the point defect in at least one discrete-structure-containing layer at a thickness Dz different from the thickness of the columnar structure-containing layer. In at least one exemplary embodiment, the designed defect mode frequencies can be achieved at desired intervals, with the symmetry of the defect mode pattern maintained. Thus, the resulting resonator can be of improved performance and exhibit an improved light confinement effect. In particular, when the center of the point defect is positioned on an axis extending in the stacking direction from the center of an intersection of projections of the columnar structures, or on an axis extending in the stacking direction from a position shifted by chosen amount (e.g., P/2) from the center of an intersection of projections of the columnar structures in either of the directions in which the columnar structures are parallely arranged. The structural symmetry of the region around the point defect can be enhanced and, accordingly, the symmetry of the defect mode pattern increases, in comparison with the conventional system described in the background. In further exemplary embodiments, the defect mode frequencies can be varied by changing the shape of the defect, facilitating the design of an increased performance resonator with the designed resonator frequency.

In the above description, the center of the point defect is positioned on an axis extending in the stacking direction of the layers from the center of an intersection of projections of the columnar structures, or on an axis extending in the stacking direction from a position shifted by a chosen amount (e.g., P/2) from the center of an intersection of projections of the columnar structures in either of the directions in which the columnar structures are parallely arranged. In practice, however, the position of the point defect may have an error of, for example, about $\pm 0.1 \times P$ with respect to the axis extending in the stacking direction. Exemplary embodiments include errors in the positioning of the point defect.

Figure 10A:
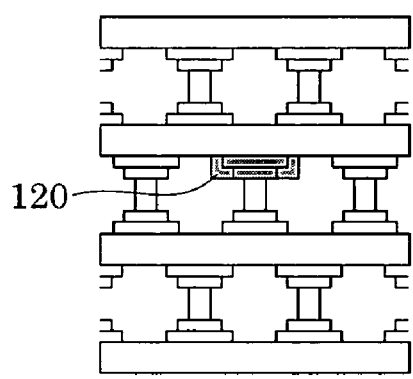
FIGS. 10A and 10B illustrate schematic representations of point defect arrangements.
Figure 10B:
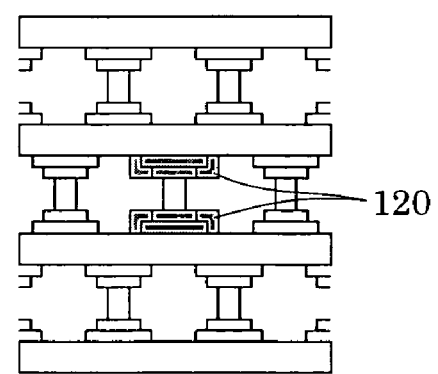

In at least one exemplary embodiment, the point defect can be formed in a discrete-structure-containing layer and its adjacent columnar structure-containing layer. To facilitate control the defect mode frequencies by varying the thickness of the point defect, the point defect may be formed in at least one discrete-structure-containing layer, as illustrated in FIGS. 10A and 10B, depending on a designed frequency.

In at least one exemplary embodiment, the adjacent discrete-structure-containing layers, for example, the second layer 102 and the third layer 103, define an additional layer, and the layers from the first layer 101 to the twelfth layer 112 define a unit of the periodic structure 100 (FIG. 1). Alternatively, the unit of the point defect structure may be defined by at least three layers including an additional layer and two columnar structure-containing layers. In this instance, the additional layer includes at least one discrete-structure-containing layers. For example, a three-dimensional photonic crystal including a first layer, a second layer, and an additional layer may be used for a functional device producing a relatively wide complete photonic band gap. The first layer includes a plurality of columnar structures arranged parallel to a first axis at a first predetermined interval. The second layer includes a plurality of columnar structures arranged parallel to a second axis at second predetermined intervals. Where in at least one exemplary embodiment the first and second predetermined intervals can be substantially equal. Similarly the third predetermined interval and the fourth predetermined interval can have the same or different value. The additional layer includes at least one sublayer containing discrete structures that can be separately arranged in a plane defined by the first and second axes. The first layer and the second layer are separated by the additional layer. The discrete structures can be disposed at positions corresponding to the intersections of projections of the columnar structures. By increasing the number of discrete-structure-containing sublayers in the additional layer, the width of the photonic band gap can be increased. By use of an additional layer including at least two discrete-structure-containing sublayers, the reflectance of three-dimensional photonic crystal at a defect mode frequency can be increased, and its directional dependency can be reduced. Thus, a resonator in accordance with at least one exemplary embodiment can produce a resonator with an increased light confinement effect and/or exhibit high performance with a high Q factor. Also, since the three-dimensional photonic crystal can have a wide photonic band gap, the defect mode frequencies can be controlled in a wide range. For example, in at least one exemplary embodiment, the manufacturing precision is increased by designing the thickness of the point defect to be substantially equal to the thickness of the additional layer or the sum of the thicknesses of a columnar structure-containing layer and its adjacent discrete-structure-containing layer.

In exemplary embodiments, the shift of the columnar structures of the first layer 101 from the columnar structures of the seventh layer 107 and the shift of the columnar structures of the fourth layer 104 from the columnar structures of the tenth layer 110 can be by a chosen amount (e.g., substantially ½ of the interval P between the columnar structures).

The periodic structure can be formed from at least two media with a high refractive index ratio. Exemplary high refractive index media include compound semiconductors such as GaAs, InP, and GaN, Si and other semiconductors, $TiO_2$ and similar dielectrics, metals, and other similar materials as known by one of ordinary skill in the relevant art and equivalents. Exemplary low refractive index media include $SiO_2$ and similar dielectrics, polymers such as polymethylmethacrylate (PMMA), gases (e.g., air), other similar materials as known by one of ordinary skill in the relevant art and equivalents. The photonic band gap of a photonic crystal results from the distribution of dielectric constants in the crystal. Combined use of media having an increased dielectric constant ratio leads to a wider complete photonic band gap. In at least one exemplary embodiment, the refractive index ratio can be at least 2. In the above example of the first exemplary embodiment, a high refractive index medium can be used as the first medium, and a low refractive index medium can be used as the second medium. However, medium 1 and medium 2 are not limited to this example, in accordance with the exemplary embodiment, can have a variety of refractive index values.

Although, in the above example of the first exemplary embodiment, the point defect can be formed of the same medium as the columnar structures and the discrete structure, the point defect may be formed of a medium having a different refractive index as well.

Second Exemplary Embodiment

Figure 11:
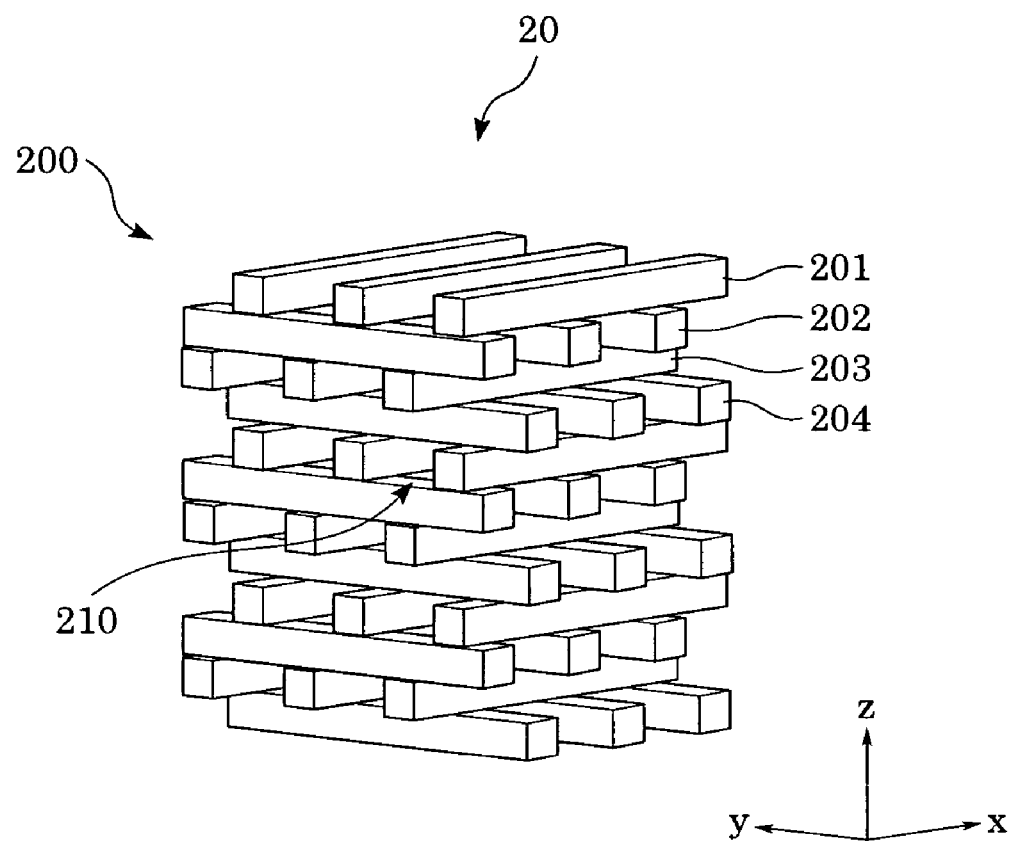
FIG. 11 illustrates a schematic representation of a resonator using a three-dimensional photonic crystal according to a second exemplary embodiment.

FIG. 11 is a schematic illustration of a resonator according to a second exemplary embodiment. The resonator 20 can include a point defect 210 provided in a periodic structure 200. The periodic structure 200 can have a period defined by four (4) layers (each substantially parallel to the xy plane) from a first layer 201 to a fourth 204. The first layer 201 and the third layer 203 each can contain a plurality of columnar structures 201a or 203a (FIG. 12) that can be formed of a first medium (e.g., having a high refractive index) so as to extend in the x-axis direction and can be arranged at regular intervals (lattice period) P in the y-axis direction. The columnar structures 201a of the first layer 201 can be shifted, (e.g., P/2 in the y-axis direction) with respect to the columnar structures 203a of the third layer 203. The second layer 202 and the fourth layer 204 each contain a plurality of columnar structures (e.g., 202a) that can be formed of the first medium so as to extend in the y-axis direction and are arranged at regular intervals P in the x-axis direction. The columnar structures 202a of the second layer 202 are shifted (e.g., P/2 in the x-axis direction) with respect to the columnar structures 204a of the fourth layer 204. The regions other than the columnar structures in each layer can be filled with a second medium (e.g., having a low refractive index). Conditions, such as the refractive indices of the first and second media, the shape and intervals of the columnar structures, and the thicknesses of the layers, can be set so as to produce a wide complete photonic band gap in a designed frequency region (wavelength region). In the example of the second exemplary embodiment, the refractive index of the first medium is set at about 3.3, and the refractive index of the second medium is set at about 1. The intervals between the columnar structures are P. Each columnar structure has a long rectangular solid shape with a height, or length in the z direction, of 0.3×P and a width, or length in the x- or y-axis direction, of 0.25×P. FIG. 13 illustrates the photonic band structure of the periodic structure 200 calculated by a mathematical method (e.g., plane wave expansion method). In FIG. 13, the horizontal axis represents the wave number vector, that is, the direction in which electromagnetic waves propagate in the photonic crystal. For example, K on the horizontal axis represents a wave number vector parallel to the x-axis direction (or y-axis direction), and X on the horizontal axis represents a wave number vector in xy planes, forming an angle of 45° with the x axis (or y axis). The vertical axis represents the frequency normalized with the lattice period of the periodic structure. FIG. 13 shows that light entering from any direction cannot be present in the region indicated by hatching in the normalized frequency range of 0.39 to 0.46; hence, a complete photonic band gap is produced in this frequency range. For example, when the intervals P between the columnar structures are 0.5 μm, a complete photonic band gap is produced in the wavelength region of 1.09 to 1.28 μm; when the intervals P are 250 nm, a complete photonic band gap is produced in the wavelength region of 540 to 640 nm.

Figure 12:
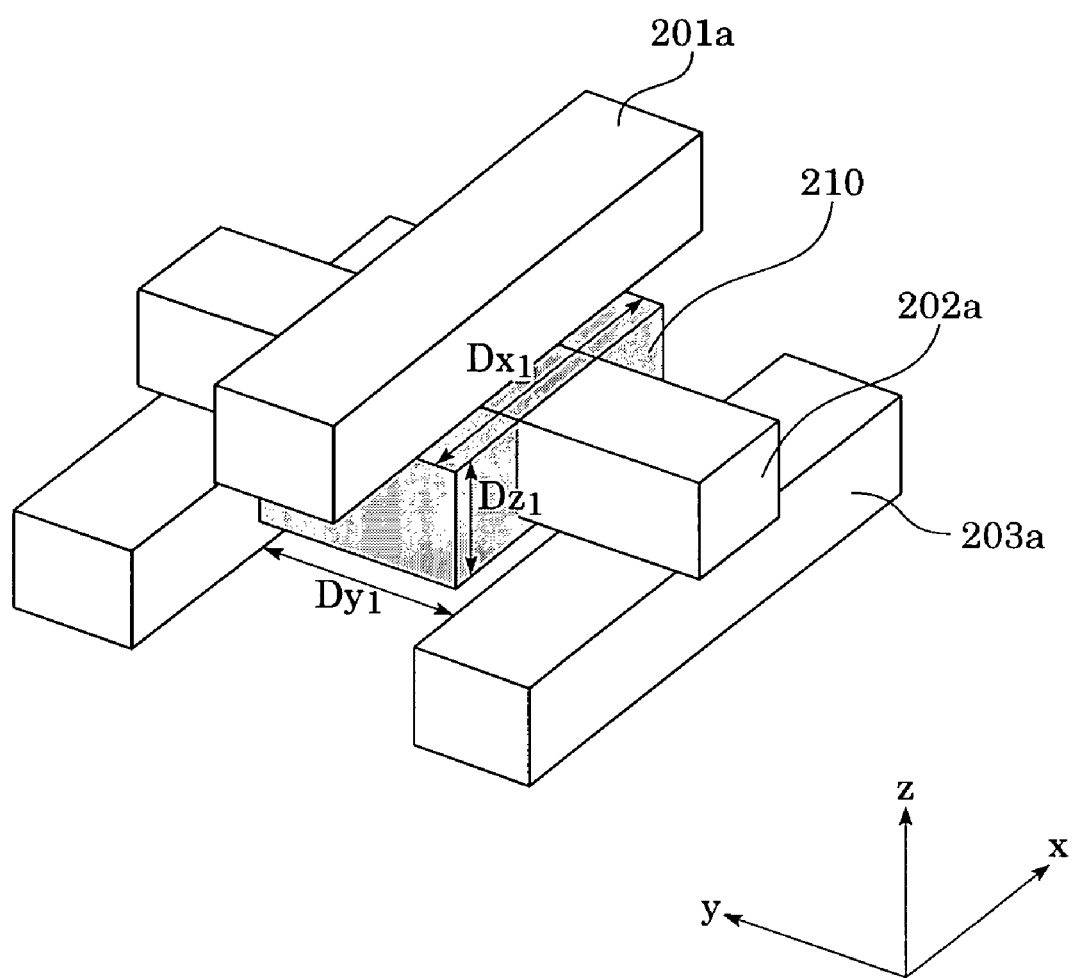
FIG. 12 illustrates an enlarged view of a region around a point defect of the resonator shown in FIG. 11.
Figure 13:
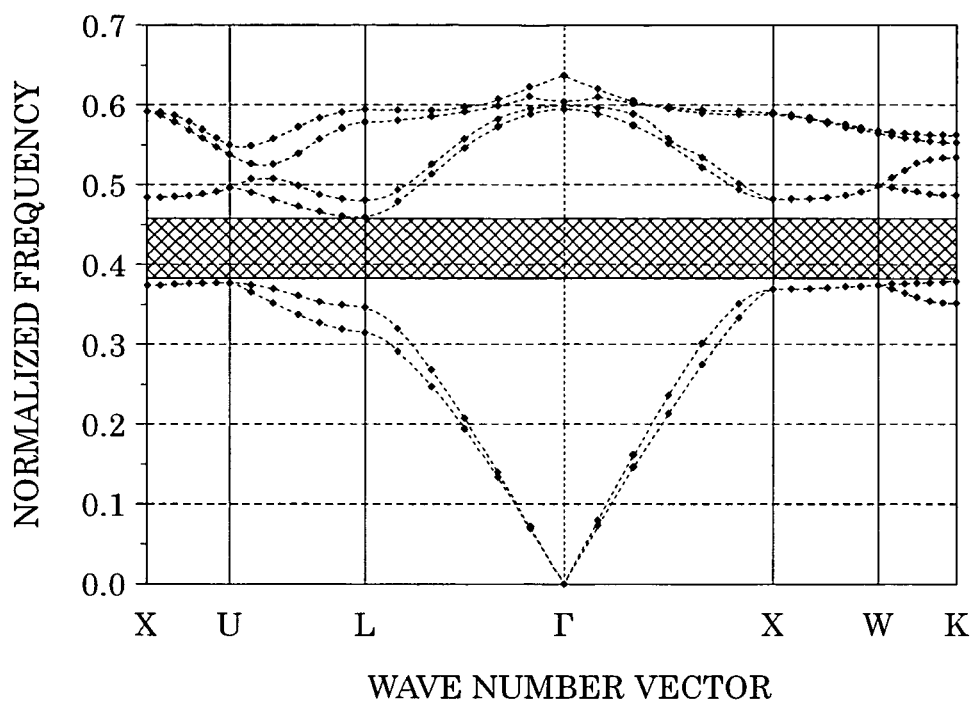
FIG. 13 illustrates a graph showing a photonic band structure according to the second exemplary embodiment.
Figure 14:
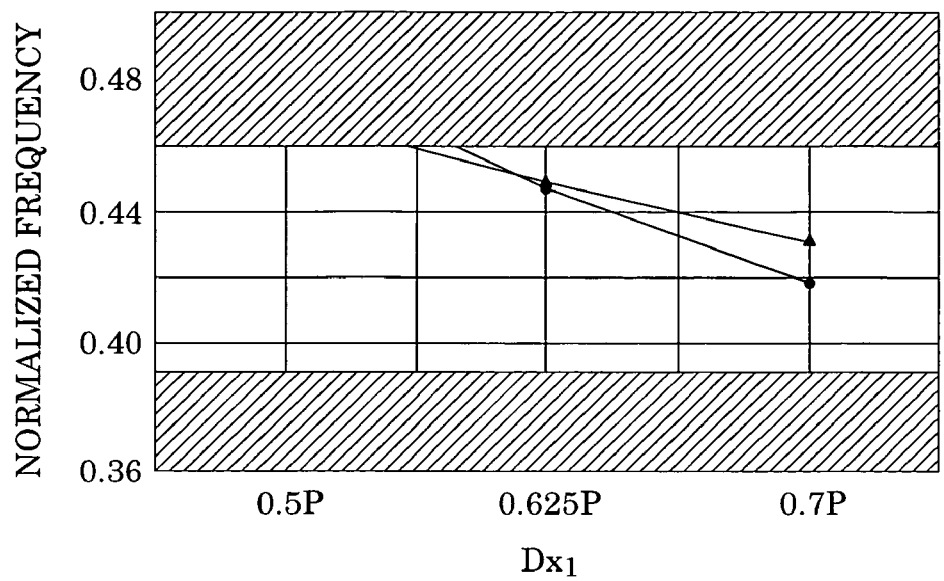
FIG. 14 illustrates a graph showing the relationship between the defect mode frequencies and the length Dx, in the x-axis direction, of the point defect according to the second exemplary embodiment.
Figure 15:
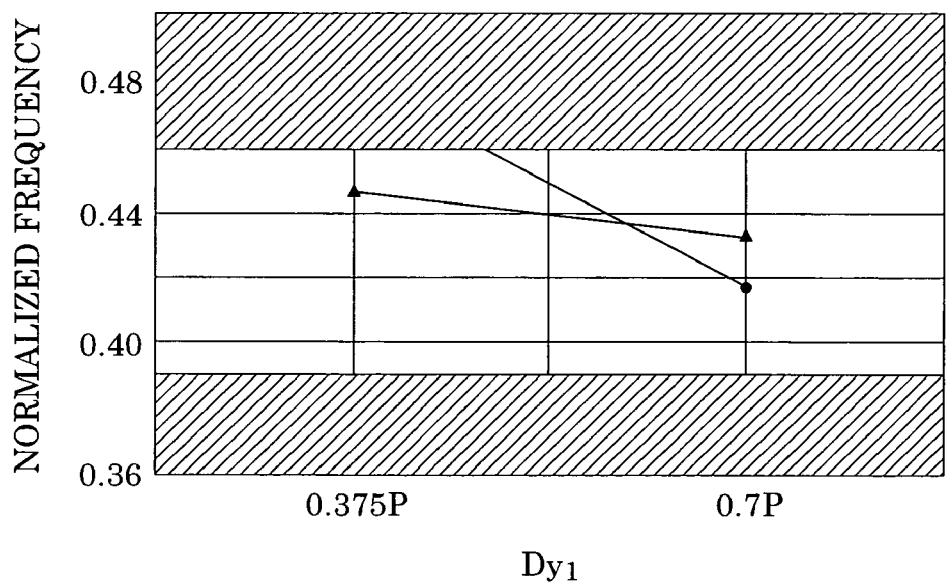
FIG. 15 illustrates a graph showing the relationship between the defect mode frequencies and the length Dy, in the y-axis direction, of the point defect according to the second exemplary embodiment.
Figure 16:
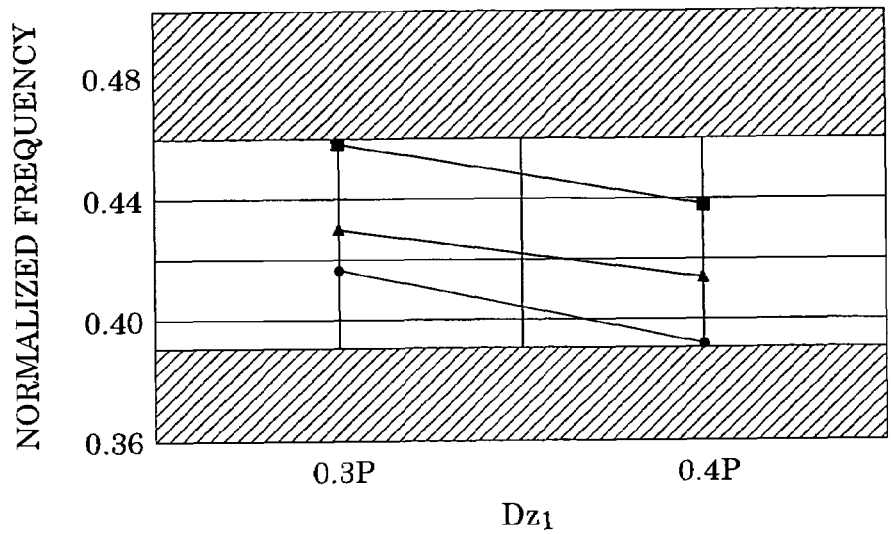
FIG. 16 illustrates a graph showing the relationship between the defect mode frequencies and the thickness Dz of the point defect according to the second exemplary embodiment.

FIG. 12 is an enlarged view of a region around the point defect 210. The point defect 210 can be formed of the same medium as the columnar structures, in the example illustrated the point defect is a rectangular solid shape with a thickness Dz1, a length Dx1 in the x-axis direction, and a length Dy1 in the y-axis direction, so as to partially contain one of the columnar structures. The point defect 210 facilitates the presence of electromagnetic waves in a part of the wavelength region of the photonic band gap of the periodic structure 200. Thus, electromagnetic waves can be confined in a very small region, and the point defect 210 can serve as a resonator exhibiting an improved confinement effect FIGS. 14 to 16 show how the defect mode frequencies of the resonator 20 shown illustrated FIG. 11 are changed depending on parameters of the shape of the point defect 210, according to the results of calculations by a mathematical method (e.g., the FDTD method). FIG. 14 illustrates the relationship between the defect mode frequencies and length Dx1 when the dimensions of the point defect are Dz1=0.3×P and Dx1=Dy1. For example, referring to FIG. 12, the point defect 210 used for the measurements is formed in the layer containing the columnar structures 202a such that the center coordinate in the x-axis direction of the point defect 210 is the same as the center coordinates in the x-axis direction of one of the columnar structures 202a, and such that the center coordinate in the y-axis direction of the point defect 210 is substantially the same as the center coordinate in the y-axis direction of one of the columnar structures 201a. The hatched frequency regions in FIG. 14 are outside the complete photonic band gap. FIG. 15 illustrates the relationship between the defect mode frequencies and length Dy1 when the dimensions of the point defect are Dz1=0.3×P and Dx1=0.75×P. For example, referring to FIG. 12, the point defect 210 used for the calculations is formed in the layer containing the columnar structures 202a such that the center coordinate in the x-axis direction of the point defect is substantially the same as the center coordinate in the x-axis direction of one of the columnar structures 202a, and such that the center coordinate of the defect in the y-axis direction is the same as the center coordinate in the y-axis direction of one of the columnar structures 201a. FIG. 16 illustrates the relationship between the defect mode frequencies and the thickness Dz1 when the dimensions of the point defect are Dx1=0.75×P and Dy1=0.375×P. For example, referring to FIG. 12, the point defect 210 used for the measurements is formed such its center coordinate in the x-axis direction is the same as the center coordinate in the x-axis direction of one of the columnar structures 202a, such that the center coordinate in the y-axis direction of the point defect 210 is substantially the same as the center coordinate in the y-axis direction of one of the columnar structures 201a, and such that the maximum coordinate in the z direction of the point defect 210 is the same as the maximum coordinate in the z direction of the columnar structure 202a.

As in the first exemplary embodiment, the complete photonic band gap of the second exemplary embodiment can produce a frequency region including a desired defect mode frequency, by controlling conditions of the second exemplary embodiment, such as the refractive indices of the first and second media of the periodic structure, the shape of and interval between the columnar structures, and the thickness of the layers. In particular, by controlling the thickness of the point defect 210 where the thickness Dz1 of the point defect differs from that of the columnar structures 205, the defect mode frequencies can be controlled in a wider range, and designed defect mode frequencies can be achieved at designed intervals, with the symmetry of the defect mode pattern maintained. The columnar structures and the point defect are not necessarily formed of the same medium, as in the first exemplary embodiment.

Figure 17:
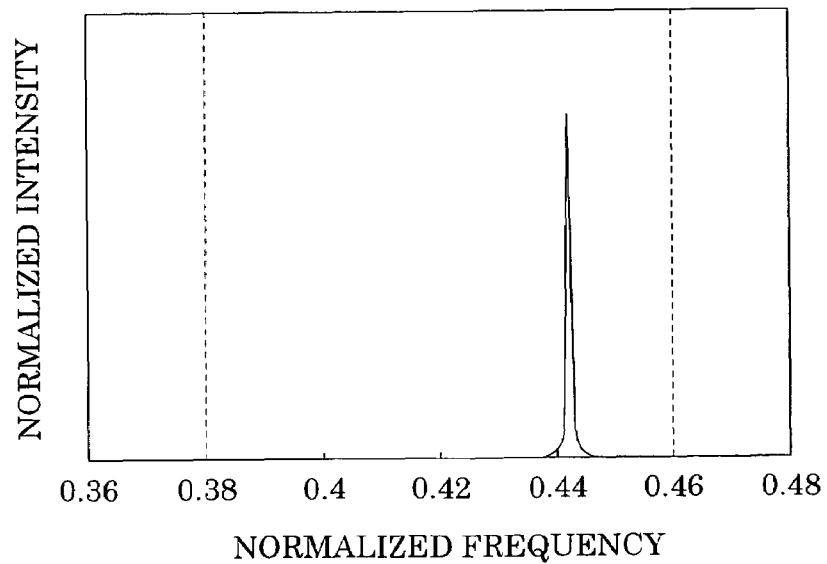
FIG. 17 illustrates a spectrum of a defect mode according to the second exemplary embodiment.
Figure 18:
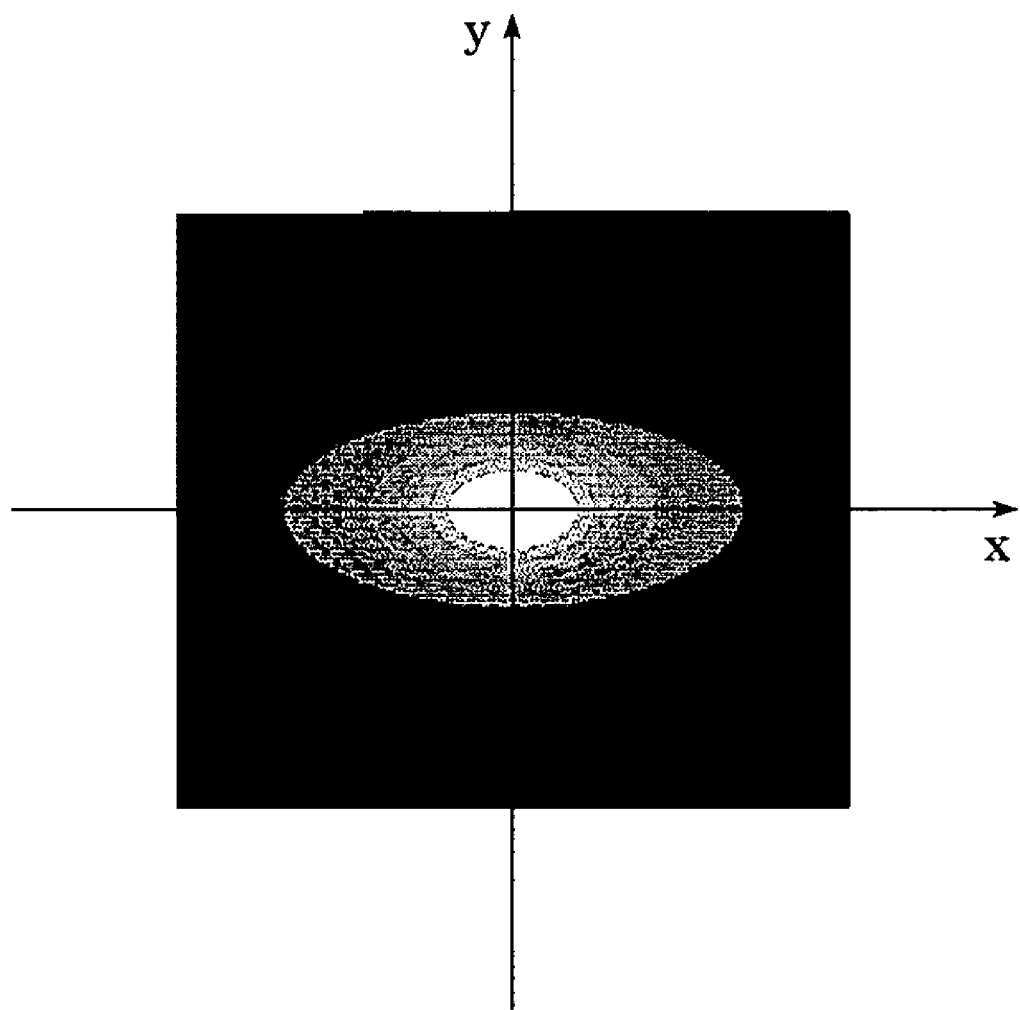
FIG. 18 illustrates a defect mode pattern of a xy section according to the second exemplary embodiment.

For example, a single defect mode can be produced in a photonic band gap, that is, a single mode can be achieved, by forming the point defect 210 shown in FIG. 12 to dimensions of $Dx1=0.75\times P$, $Dy1=0.375\times P$, and $Dz1=0.35\times P$ such that its center coordinate in the x-axis direction is the same as the center coordinate of one of the columnar structures 202a, such that the center coordinate in the y-axis direction is the same as the center coordinate of one of the columnar structures 201a, and such that its maximum coordinate in the z direction is the same as that of the columnar structure 202a. Note that the above dimensions for the point defect 210 are intended for illustration only and not as limiting factors. Further exemplary embodiments can have various other dimensions of the point defect. FIG. 17 illustrates the spectrum of defect mode frequency of a periodic structure 200 formed at 8 periods in the x- and y-axis directions and 4 periods of the z direction with the point defect 210 at the center of the periodic structure 200, and FIG. 18 illustrates a defect mode pattern of an xy section of the periodic structure. FIGS. 17 and 18 show that a highly symmetrical single defect mode pattern has been achieved.

Third Exemplary Embodiment

Figure 19:
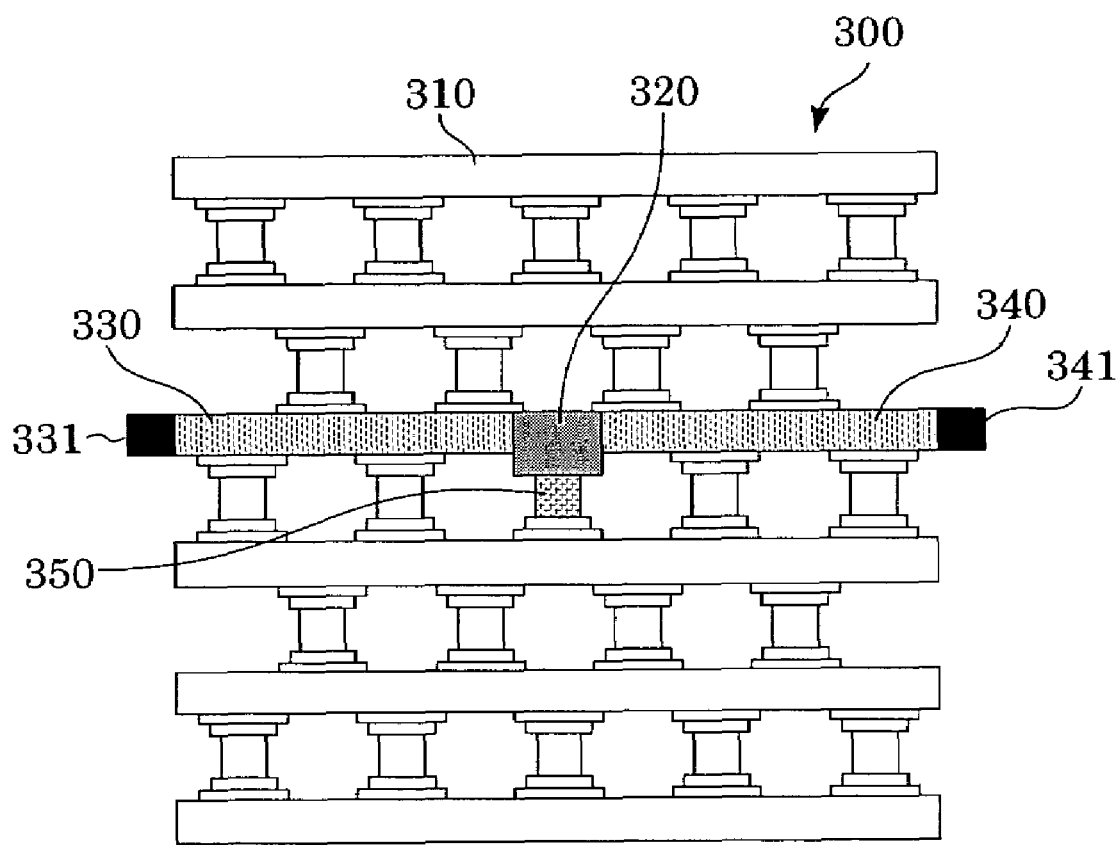
FIG. 19 illustrates a schematic representation of a laser device.

An optical-function device including a resonator according to exemplary embodiments will now be described. The point defect of the three-dimensional photonic crystal according to the first or the second exemplary embodiment can be filled with an active medium capable of emitting light, and energy, such as electromagnetic waves or current, when driven by a driver. Thus, an increased efficient light emitting device, (e.g., a laser, an LED, other light emitting devices as known by one of ordinary skill in the relevant arts, and equivalents) can be facilitated. The active medium can be selected from, for example, materials having a multi-quantum well structure or multi-quantum dot structure, such as InGaAsP, AlGaAs, AlGaInP, AlGaN, InGaN, ZnSe, and ZnS, organic materials, other multi-quantum well or dot structures as known by one of ordinary skill in the relevant art and equivalents, according to the designed resonant wavelength. Thus, an increased efficient laser light source can be achieved which can be suitably used for displays, optical communications, THz light, and DVD optical pickups. FIG. 19 illustrates the structure of a laser device having an active portion that emits light by carrier injection, in a point defect. The laser device 300 includes a resonator prepared by forming a point defect 320 in a periodic structure 310 according to the first or the second exemplary embodiment, a p-type electrode 331, a p-type carrier conduction path 330, an n-type electrode 341, an n-type carrier conduction path 340, and a waveguide 350. The resonator has an active portion inside that emits light by carrier injection. The waveguide 350 can be produced by a linear defect that can be formed in the periodic structure 310 so as to disturb the periodicity. The wavelength of the waveguide mode can be set so as to increase the combination efficiency with the resonator, in consideration of the resonance mode, by varying the shape and refractive index of the linear defect. The linear defect can be formed by changing the shape or refractive index of some of the columnar structures in the periodic structure 310, or by providing an additional columnar structure. Holes can be supplied to the resonator through the p-type electrode 331 and the p-type carrier conduction path 330, and electrons can be supplied to the resonator through the n-type electrode 341 and the n-type carrier conduction path 340. The holes and electrons can be combined in the resonator to emit light or generate laser light, and the light can be extracted through the waveguide 350.

Figure 20:
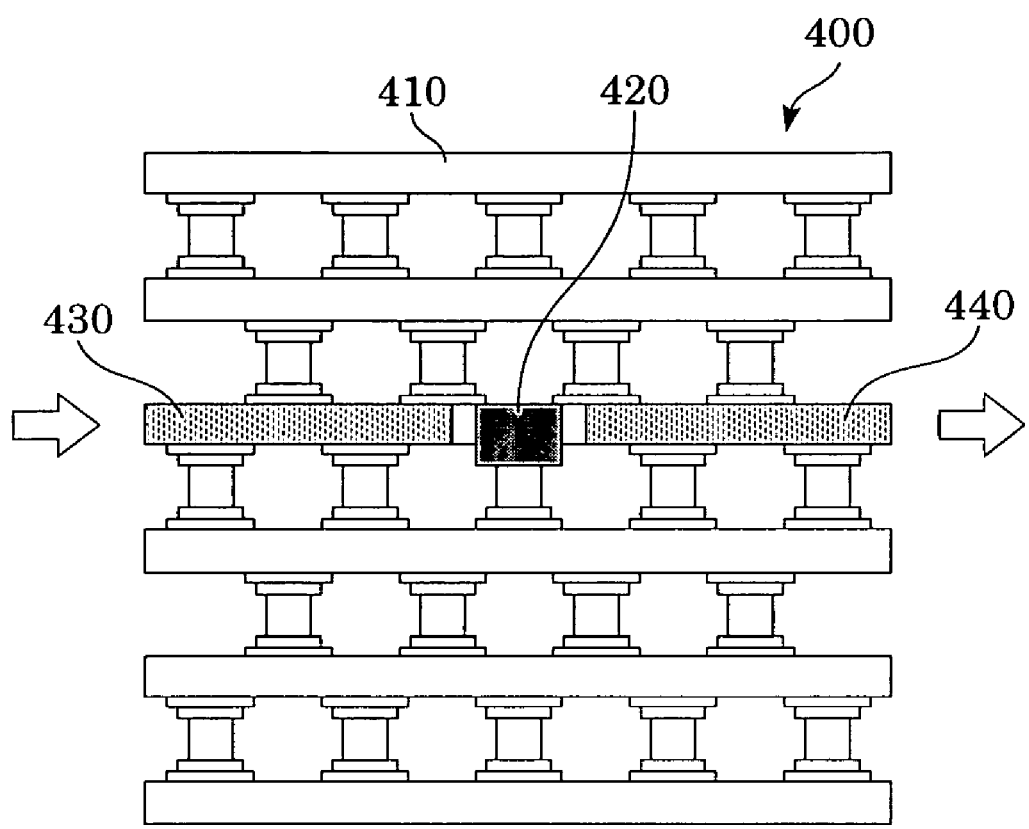
FIG. 20 illustrates a schematic representation of a wavelength conversion device.

The point defect in the three-dimensional photonic crystal according to the first or the second exemplary embodiment may be filled with a nonlinear material, and energy, such as the electromagnetic waves or current, may be supplied to the nonlinear material. Since this structure can confine light with a strong energy in a very narrow region, the resulting nonlinear optical device can produce increased nonlinear optical effects. The nonlinear material may be $LiNbO_3$, $LiTaO_3$, $BaTiO_3$, $ZnO$, $BaB_2O_4$, $BiB_3O_6$, $KTiOPO_4$, or other nonlinear material as known by one of ordinary skill in the relevant art or equivalents. FIG. 20 illustrates a wavelength conversion device 400 using the nonlinear optical effect. The wavelength conversion device 400 includes a resonator prepared by forming a point defect 420 in a periodic structure 410 according to the first or the second exemplary embodiment, an input waveguide 430, and an output waveguide 440. The inside of the resonator can be filled with a nonlinear material. The input waveguide 430 and the output waveguide 440 can each be produced by a linear defect that can be formed in the periodic structure 410 so as to disturb the periodicity. The wavelength of the waveguide mode can be selected according to, for example, the shape and refractive index of the linear defect. Light introduced into the input waveguide 430 from the outside (e.g., through a lens or a fiber) can be converted into second or higher harmonics in the resonator. The harmonics are extracted through the output waveguide 440. The guided wavelength region of the input waveguide 430 can be set so as to include the wavelength of the incident light, not including the wavelength of the converted light, and the guided wavelength region of the output waveguide 440 can be set so as to include the wavelength of the converted light, not including the wavelength of the incident light. Thus, the wavelength of incident light can be efficiently converted and the converted light can efficiently be extracted. Light having a plurality of wavelengths may be used. This light can be converted by use of a nonlinear effect of light other than harmonics, such as sum of light frequencies or difference frequency light, and can then be extracted.

The three-dimensional photonic crystal optical resonators 10 and 20 according to the first and the second exemplary embodiment can be used as part of wavelength selection filters. The wavelength selection filters can output light with a frequency with high selectivity, according to the defect mode.

Furthermore, the above-described optical functional devices can be combined to prepare an optical circuit. By sharing the same periodic structure among the optical functional devices, the size of the optical circuit can be further reduced.

Exemplary embodiments can use three-dimensional photonic crystals with point defects that can serve as a resonator having designed defect mode frequencies at designed intervals, while maintaining the symmetry of the defect mode patterns. The resonator can be of increased performance and exhibits an increased light confinement effect over some conventional systems. By use of the resonator in a laser, the laser can oscillate at a desired wavelength with high efficiency. The resonator according to the present invention can achieve highly functional optical devices.

Exemplary embodiments are capable of being used in many devices, for example in light emitting devices and wavelength conversion devices.

While the present invention has been described with reference to exemplary embodiments, it is to be understood that the invention is not limited to the disclosed embodiments. The scope of the following claims is to be accorded the broadest interpretation so as to encompass all modifications and equivalent structures and functions. For example, in the interest of acting as ones own lexicographer, although the following claims cite terms such as "direction perpendicular", the intended meaning of these terms within the scope of the claims is to include arrangements where the "direction is substantially perpendicular" or "essentially perpendicular." Additionally, the term "plane parallel" is intended to include arrangements where the "plane is essentially parallel." For example the intended scope is perpendicular or parallel within a variance of the true perpendicular or parallel position (e.g., with a few degrees inclination). Likewise the phrase "layer are orthogonal" is intended to include arrangements where the "layer is substantially orthogonal" and the term "extending in the same direction" is intended to include the arrangements "extending in about the same direction." For example the intended scope is meant to include the same direction and orthogonal within a variance of the true same direction or orthogonal position (e.g., a few degrees inclination). Finally the term "one-half of" is intended to include arrangements of "about one-half" (i.e., one-half within a variance (e.g., 1% of ½)).

This application claims priority from Japanese Application No. 2004-301374 filed Oct. 15, 2004, which is hereby incorporated by reference herein in its entirety.

What is claimed is:

1. A resonator including a point defect formed in a three-dimensional photonic crystal, the three-dimensional photonic crystal comprising:
   a first layer including a plurality of columnar structures spaced apart by a first predetermined interval;
   a second layer including a plurality of columnar structures spaced apart by a second predetermined interval, the columnar structures extending in a direction different from that of the columnar structures in the first layer;
   a third layer including a plurality of columnar structures spaced apart by a first predetermined interval, the columnar structures extending in the same direction as that of the columnar structures in the first layer;
   a fourth layer including a plurality of columnar structures spaced apart by a second predetermined interval, the columnar structures extending in the same direction as that of the columnar structures in the second layer;
   and additional layers, each including at least one sublayer containing discrete structures disposed discretely in a plane parallel to each of the four layers, wherein the first to fourth layers are stacked sequentially with the additional layer between the adjacent two layers thereof,
   the first layer and the third layer are stacked such that the columnar structures contained in the two layers are mutually shifted by one-half the first predetermined interval in the direction, in the layers, perpendicular to the direction of the extension of the columnar structures,
   the second layer and the fourth layer are stacked such that the columnar structures contained in the two layers mutually shift by one-half the second predetermined interval in a direction perpendicular to the direction of the extension of the columnar structures,
   discrete structures contained in the additional layers are disposed at the positions corresponding to the intersections of the columnar structures,
   wherein the point defect is formed including at least one of the sublayers containing the discrete structures, and
   wherein the point defect is formed of high refractive index media.

2. The resonator according to claim 1, wherein each additional layer includes at least two sublayers containing the discrete structures.

3. The resonator according to claim 1, wherein the columnar structures of the first layer are orthogonal to the columnar structures of the second layer.

4. The resonator according to claim 1, wherein the first and second predetermined intervals are equal.

5. The resonator according to claim 1, wherein the point defect is formed only in at least one sublayer containing the discrete structures.

6. The resonator according to claim 1, wherein the point defect is formed in one of the layers containing the columnar structures and the adjacent sublayer containing the discrete structures.

7. The resonator according to claim 1, wherein the point defect is of a medium different from the medium of the columnar structures.

8. The resonator according to claim 1, wherein the point defect is of the same medium as the columnar structures.

9. The resonator according to claim 1, wherein the point defect is disposed such that the center of the point defect lies on an axis extending in the stacking direction of the layers from the center of an intersection of projections of the columnar structures.

10. The resonator according to any one of claims 1, wherein the point defect is disposed such that the center of the point defect lies on an axis extending in the stacking direction of the layers from a position shifted by one-half of the predetermined interval in either of the directions in which the columnar structures are arranged in a plane perpendicular to the stacking direction, from the center of an intersection of projections of the columnar structures.

11. The resonator according to claim 1, wherein the resonator operates in a single mode.

12. A light emitting device comprising:
   the resonator according to claim 1; and
   an excitation device for exciting an active medium that emits light,
   wherein the resonator contains the active medium.

13. A wavelength conversion device comprising the resonator according to claim 1, wherein the resonator contains a nonlinear material.

14. The resonator according to claim 1, wherein the resonator serves as a wavelength selection filter.

* * * * *